(12) United States Patent
Hlibowicki

(10) Patent No.: US 8,421,535 B2
(45) Date of Patent: Apr. 16, 2013

(54) METHOD AND APPARATUS FOR REDUCING DISTORTION IN CLASS D AMPLIFIER

(75) Inventor: Stefan Roman Hlibowicki, Toronto (CA)

(73) Assignee: Adamson Systems Engineering Inc., Port Perry, ON (CA)

( * ) Notice: Subject to any disclaimer, the term of this patent is extended or adjusted under 35 U.S.C. 154(b) by 65 days.

(21) Appl. No.: 13/205,088

(22) Filed: Aug. 8, 2011

(65) Prior Publication Data

US 2013/0038391 A1 Feb. 14, 2013

(51) Int. Cl.
*H03F 3/217* (2006.01)

(52) U.S. Cl.
USPC ........................................ 330/251; 330/207 A

(58) Field of Classification Search .................... 330/10, 330/207 A, 251
See application file for complete search history.

(56) References Cited

U.S. PATENT DOCUMENTS

| | | | |
|---|---|---|---|
| 6,498,531 B1 * | 12/2002 | Ulrick et al. .................... | 330/10 |
| 6,924,700 B2 | 8/2005 | Taura et al. | |
| 7,265,617 B2 | 9/2007 | Ohkuri | |
| 7,518,442 B1 | 4/2009 | Dijkstra et al. | |
| 7,777,562 B2 | 8/2010 | Wei et al. | |
| 7,795,970 B2 | 9/2010 | Kaya et al. | |
| 7,961,047 B2 * | 6/2011 | Pillonnet et al. .......... | 330/207 A |
| 8,289,075 B2 * | 10/2012 | Kishii et al. .................... | 330/51 |
| 2010/0290646 A1 * | 11/2010 | Pillonnet et al. .......... | 330/207 A |
| 2010/0321570 A1 | 12/2010 | Odagiri | |

* cited by examiner

*Primary Examiner* — Khanh V Nguyen

(74) *Attorney, Agent, or Firm* — Lynn C. Schumacher; Hill & Schumacher

(57) ABSTRACT

Provided are apparatuses and methods for reducing nonlinear distortions in Class D amplifiers by dynamically changing first and second threshold voltages in a pulse width modulator. A Class D amplifier apparatus is disclosed, comprising a pulse width modulator whose operation relies on a first and second threshold value, and a threshold controller which varies the thresholds in response to internal signals in the amplifier. Further, a method of processing Class D amplifier internal signals is disclosed, comprising steps involving measuring internal signals in a Class D amplifier and varying threshold signals in response to those measurements within the amplifier.

26 Claims, 11 Drawing Sheets

METHOD AND APPARATUS FOR REDUCING DISTORTION IN CLASS D AMPLIFIER

FIELD OF THE INVENTION

The present invention relates to Class D amplifier circuits, and more particularly circuits which reduce the nonlinear distortions introduced by the power stage of Class D amplifiers.

BACKGROUND OF THE INVENTION

Class D amplifiers, otherwise known as switching amplifiers, are devices which amplify input analog signals and deliver power to a load by first converting them to a series of modulated square wave pulses, controlling a power stage with those pulses to create a high-amplitude square wave, and then converting the square wave into an high-amplitude output analog signal which, ideally, is equivalent to the input analog signal multiplied by some gain. They are well known in the art to have a much higher efficiency than their analog counterparts, because the output power devices only ever operate as an ON/OFF switch. That is to say, no power is lost as heat, as in the case of their linear amplifier counterparts. Thus, Class D amplifiers theoretically have an efficiency of 100% with practical applications of such devices typically having efficiencies well over 90% and maintain this efficiency with the variation of input signal, while linear analog amplifiers can achieve a theoretical maximum of about 78% and much lower at lower input signals.

A typical method of pulse modulation is Pulse Width Modulation. Pulse Width Modulation (PWM), has a number of implementations which each determine differently when the voltage should switch from the high to the low level (or vice versa). For example, in one common form of PWM, the pulse width modulator combines an input analog signal with a high frequency triangular waveform and compares it with an upper and lower threshold voltage. The triangular waveform is generated by a feedback loop which includes the amplifier power stage, in a self oscillating configuration. The advantage of such a configuration is that this feedback loop not only generates a triangular waveform, but also provides feedback for the output signal, improving amplifier performance. Each time the negative-going slope of the triangular waveform reaches the lower threshold it switches to the positive-going slope and the conversion output switches to the low voltage; conversely, each time the positive-going slope of the triangular waveform reaches the upper threshold it switches to the negative-going slope and the conversion output switches to the high voltage. The result is a square wave with modulated width or duty cycle. In this type of class D amplifier, the frequency of the square wave varies with amplifier input signal. Some other class D amplifiers have an independent triangular waveform generator running at a constant frequency. In this configuration, both threshold voltages are equal and proportional to amplifier input signal, and the PWM output voltage switches from high to low (or vice versa) every time the triangular generator voltage crosses input voltage.

The result of this conversion is then used to turn ON and OFF the power stage devices, resulting in a high efficiency amplification. After amplification of the pulse train, a low-pass filter connected to amplifier output eliminates the unwanted high frequency components from the overall output signal.

A drawback of Class D amplifiers is that they suffer signal distortion issues due to their switching operation. For instance, one cause of this distortion is that the power stage devices do not switch ON and OFF at the exact moments determined by the pulse width modulator. The delay between desired and achievable switching times varies and depends on the amplifier output voltage, output current and frequency, and results in nonlinear distortions. Furthermore, additional difficulties in reducing class D amplifier distortions come from the rapid variations in the switching delays, which generate higher order harmonics in the output signal. Despite these distortions, Class D amplifiers are still used in high power applications due to their efficiency, and thus, efforts are now directed towards reducing the nonlinear distortions.

Some basic techniques for reducing such distortions exist, and commonly use linear negative feedback loops. In such designs, typically the stronger the gain of the feedback loop, the higher the level of distortion reduction is. Unfortunately the gain of feedback loop is limited by the ratio of switching frequency to the highest input signal frequency, and by the stability of the system. Some designs of self oscillating amplifiers use a second order integrator to reduce distortions coming from the integrator output.

U.S. Pat. No. 6,924,700 to Taura et al. discloses a pulse modulated signal output from a pulse modulator and a feedback signal containing distortion caused by a power switch are integrated in a first integrator and a second integrator, respectively, and are input to input terminals of a comparator, respectively, so that a correction signal (Vc) is generated.

U.S. Pat. No. 7,777,562 to Wei et al. discloses a digital Class-D amplifier distortion suppression circuit design. A distortion suppression feedback loop is described to improve audio performance by suppressing output stage non-linearity and improving power supply noise rejection achieving reduced THD+N. The feedback loop is placed around the power stage. It forces tracking between the audio band signals at the input and output of the power stage by automatically adjusting the gating signal timing based on sensed effective duty ratio error. Error sensing and compensation are performed using techniques that lend to simple circuit implementation.

U.S. Pat. No. 7,795,970 to Kaya et al. discloses a pulse-width-modulating class D amplifier with an H-bridge output stage, and method of operating the same in which output stage dead-time is compensated. Offset logic circuitry detects various dead-time-related conditions at push-pull output drivers, and generates an offset signal applied to the amplified differential input signal, to adjust the time at which the voltage at differential signal lines crosses a ramp reference waveform. The offset signal can correspond to the duration of a disturbance (dead-time at one driver in combination with an active signal at the active driver), or the sum of that disturbance duration with a dead-time at the active driver. The offset signal is generated by charging a capacitor for the duration of this disturbance, or disturbance plus dead-time. According to another approach, error is reduced by charging a capacitor for each transition of the signal for a duration of the dead-time of the active driver.

U.S. Application Publication No. 2010/0321570 to Odagiri discloses a triangular-wave correction circuit which compensates a gradient of a triangular wave provided to a triangular-wave signal generator which supplies a triangular wave signal used as a PWM carrier to a comparison circuit for performing PWM modulation of an input signal.

U.S. Pat. No. 7,518,442 to Dijkstra et al. discloses a class D amplifier including a modulator and a class D power stage. The modulator provides a PWM output signal to the class D power stage. For each pulse of the PWM input signal, the class D amplifier provides a corresponding pulse in the PWM output signal, such that the pulse is terminated when the area under the pulse of the output of the class D power stage is substantially equal to the area under the pulse of the corresponding PWM input signal. In this way, the class D amplifier provides instantaneous per-pulse PWM feedback.

U.S. Pat. No. 7,265,617 to Ohkuri discloses a class D amplifier having switching amplifying unit, which includes a pair of switching elements. The unit drives the switching elements and generates pulse amplified switching signals. The amplifier also has a signal-generating unit, which generates pulse width modulation signals each for driving the switching elements and supplies the generated pulse-width modulation signals to the switching amplifying unit. The switching amplifying unit includes a detecting sub-unit, which detects an operating state of the switching elements. The signal generating unit includes a dead-time-setting sub-unit, which sets dead time relative to the switching elements by delaying each of the pulse width modulation signals using propagation delay times in logic devices. The signal generating unit also includes a control sub-unit, which controls the dead-time-setting sub-unit based on a detected result of the detecting sub-unit to change the dead time based on the operating state of the switching elements.

Therefore, it would be advantageous to provide a device that overcomes the aforementioned difficulties.

SUMMARY OF THE INVENTION

The present invention provides apparatuses and methods for reducing nonlinear distortions in class D amplifier by dynamically changing first and second threshold voltages in pulse width modulator.

One embodiment of the invention is a Class D amplifier apparatus, comprising: a pulse width modulator configured to compare a triangular signal to an upper and lower threshold value to generate a square wave; and a threshold controller configured to store upper and lower sample values of the triangular signal, to compute an upper difference by subtracting a target upper threshold value from the upper sample value, to compute a lower difference by subtracting a target lower threshold value from the lower sample value, and based on the upper and lower differences, to update the upper and lower threshold values. In some embodiments, the pulse width modulator may compare the signals and thresholds with a comparator, and may have other functions in addition to that described, such as creating the triangular signal with an integrator.

Another embodiment of the invention is a method of processing Class D amplifier internal signals, comprising the steps of: storing a first and second threshold value in a first and second electronic component, respectively; measuring a first and second sample voltage of a triangular signal and storing the first and second sample voltage in a third and fourth electronic component, respectively; storing a first and second target threshold voltage in a fifth and sixth electronic component, respectively; subtracting the first target threshold voltage from the first sample voltage to form a first difference voltage; subtracting the second target threshold voltage from the second sample voltage to form a second difference voltage; updating the first threshold voltage by subtracting the first difference voltage from the first threshold voltage, and updating the second threshold voltage by subtracting the second difference voltage from the second threshold voltage; and comparing the triangular signal to the first and second threshold voltages to form a square wave.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIG. 2b is the spectrum (in Volts) of the signal in FIG. 2a;

FIG. 3b is a spectrum (in %) of the output analog signal in FIG. 3a;

FIG. 5b is the spectrum (in Volts) of the signal in FIG. 5a;

FIG. 6b is the spectrum (in %) of the signals in FIG. 6a;

DETAILED DESCRIPTION OF THE INVENTION

Figure 1:
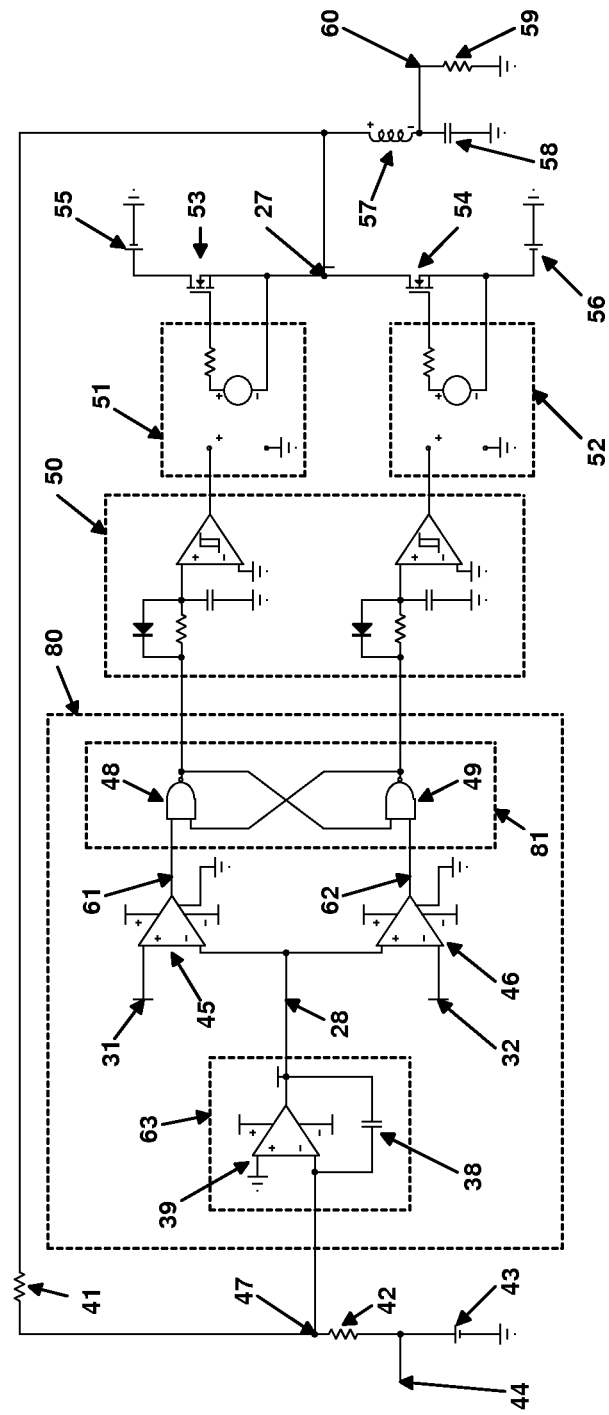
FIG. 1 is a simplified schematic diagram of prior art half bridge class D amplifier.

The systems described herein are directed, in general, to Class D amplifier circuits. Although embodiments of the present invention are disclosed herein, the disclosed embodiments are merely exemplary and it should be understood that the invention relates to many alternative forms, including different shapes and sizes. Furthermore, the Figures are not drawn to scale and some features may be exaggerated or minimized to show details of particular features while related elements may have been eliminated to prevent obscuring novel aspects. Therefore, specific structural and functional details disclosed herein are not to be interpreted as limiting but merely as a basis for the claims and as a representative basis for enabling someone skilled in the art to employ the present invention in a variety of manners.

As used herein, the terms "comprises", "comprising", "includes", "including" and "having" are to be construed as being inclusive and open ended, and not exclusive. Specifically, when used in this specification including claims, the terms "comprises", "comprising", "includes", "including" and "having" and variations thereof mean the specified features, steps or components are included. These terms are not to be interpreted to exclude the presence of other features, steps or components.

As used herein, the terms "substantially", "about" and "approximately", when used in conjunction with ranges of dimensions, compositions of mixtures or other physical properties or characteristics, is meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present invention.

As used herein, the coordinating conjunction "and/or" is meant to be a selection between a logical disjunction and a logical conjunction of the adjacent words, phrases, or clauses. Specifically, the phrase "X and/or Y" is meant to be interpreted as "one or both of X and Y" wherein X and Y are any word, phrase, or clause.

As used herein, the terms "square wave", "pulse wave" and variants thereof refer to a signal having four states: a first state where the value lies within a first range, a second state where the value lies within a second range, a third state where the value transitions from the first range to the second range, and a fourth state where the value transitions from the second range to the first range, where the signal spends the majority of the time in the first or second state. The terms "rising edge" and "falling edge" in the context of square waves refers to the third state and fourth state, where the first range comprises lower values than the second range. In this context, the term "edge" refers to a pulse wave in either the third or fourth state. Finally, in this context, the term "low" refers to the first state, and the term "high" refers to the second state, where the first range comprises lower values than the second range.

As used herein, the term "triangular wave" and variants thereof refers to a signal having two states and switching between them: a first state where the value is linearly or almost linearly increasing and a second state where the value is linearly or almost linearly decreasing, where there is no restriction on the rate of increase or decrease of the signal, and no restriction on whether the rate of increase or decrease stays the same from one period to another. The "peak" of a triangular wave refers to a point of the signal where it switches from the first state to the second, or vice versa.

As used herein, an "electronic component" or "electrical component" is any component of any functional complexity which is connectable to an electric circuit; for example, it may be a simple component such as a wire or passive component, or it may refer to a complex component such as a circuit, an integrated circuit or processor.

As used herein, the term "configured to" shall be construed as non-limiting, i.e. it does not preclude the item it refers to from having other features or functions.

A simplified schematic diagram of a typical prior art self oscillating half bridge class D amplifier is shown in FIG. 1. A summing node 47 of an integrator 63, built using operational amplifier 39 and capacitor 38, receives currents through resistors 41 and 42. One of the currents is proportional to the voltage at amplifier input 44 (schematically represented by voltage source or battery 43), and another to the voltage at the output 27. The sum of these two currents charges capacitor 38 causing the voltage at the integrator output 28 to swing between two threshold voltages applied to the inputs 31 and 32 of comparators 45 and 46. The voltages at the outputs 61 and 62 of the comparators 45 and 46 change the state of the flip-flop 81 built using gates 48 and 49. This results in a square wave signal being produced at the outputs of the flip-flop 81, with the duty cycle of the square wave signal being proportional to the signal at input 44. The outputs of the flip-flop 81 are fed into delay circuit 50, which introduces a delay to the leading edges of gate signals while the trailing edges are almost unaffected. The delay circuit 50 is often referred to as a dead time generator, and prevents both FETs from being on at the same time. Driver circuits 51 and 52 are simplified FET gate drivers, whose inputs are the outputs of the delay circuit 50. As a result, a change in the flip-flop 81 state causes the signal to propagate through the delay circuit 50 and the driver circuits 51 and 52, resulting in a corresponding amplified change in the voltage at node 27 between the negative 56 and positive 55 supply voltage. Thus, the signal at the input 44 is converted by the Class D amplifier to a triangular waveform at the integrator output node 28, a square waveform at the outputs of the flip-flop 81 gates 48 and 49, and to an amplified square waveform at node 27. Finally, an inductor 57 and capacitor 58 filter out high frequency components, i.e., those introduced by switching, from the signal resulting in the amplified output signal at node 60. In this circuit diagram, resistor 59 represents a load on the amplifier, and it will be understood by one skilled in the art that this resistor 59 represents a general load and may be any electronic component that accepts an analog signal input, for example, a loudspeaker.

Figure 2A:
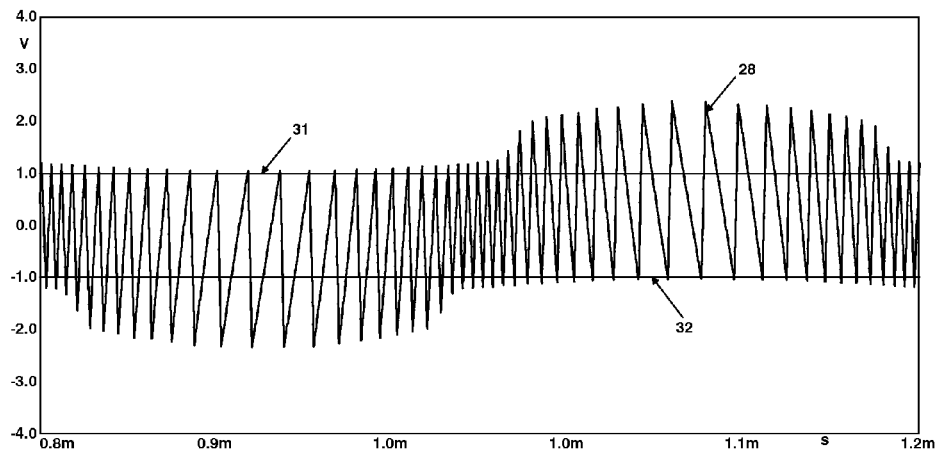
FIG. 2a is an example of the output signal of the integrator with a 2.5 kHz sine input signal in the amplifier shown in FIG. 1.
Figure 2B:
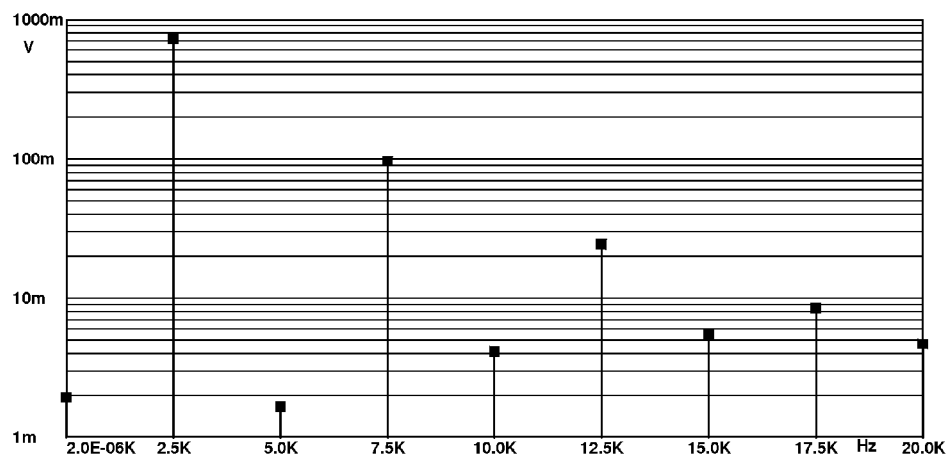

An example of a signal at the output 28 of integrator 63 in the prior art Class D amplifier circuit is shown in FIG. 2a. The example assumes 2.5 kHz sinusoidal input signal and +1V threshold voltage at input 31 and −1V at input 32. This figure demonstrates that the triangular waveform produced by the integrator 63 does not fit between +1V and −1V threshold lines. The overshoots are caused by the time delay between when the input voltage 28 to the comparators reaches either of the threshold voltages at 31 and 32 and when the voltage at output 27 changes. This delay is generated mainly by the delay circuit 50 and by the power FETs 53 and 54 in relation with the inductor 57. The value of the overall delay varies with output signal voltage and current. FIG. 2b shows the audio range of the frequency spectrum of the signal at 28. It is noted that, ideally, with the 2.5 kHz sine wave input signal, this spectrum should consist of a single spike at 2.5 kHz; however, due to the delay in the amplifier circuit, distortion occurs which introduces harmonics in the audio range. The harmonic signals pass through capacitor 38 to node 47 of integrator 63, and since this is a summing node, these harmonic signals must also appear at the amplifier output 60 in different proportions. It will be noted that the capacitor 38 is not the only signal path from node 28 to node 47; for example, the limited open loop gain of operational amplifier 39 is another reason for the presence of harmonic signals at node 47.

Figure 3A:
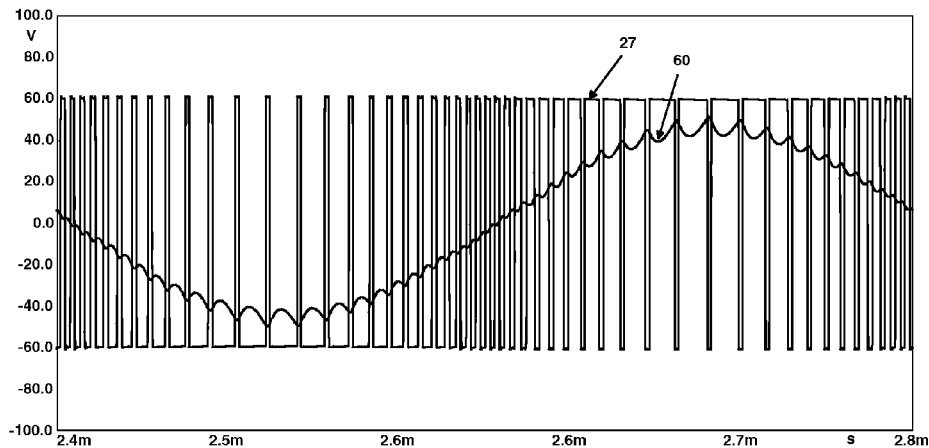
FIG. 3a shows the amplifier output signals with the 2.5 kHz sine input signal in the amplifier shown in FIG. 1.
Figure 3B:
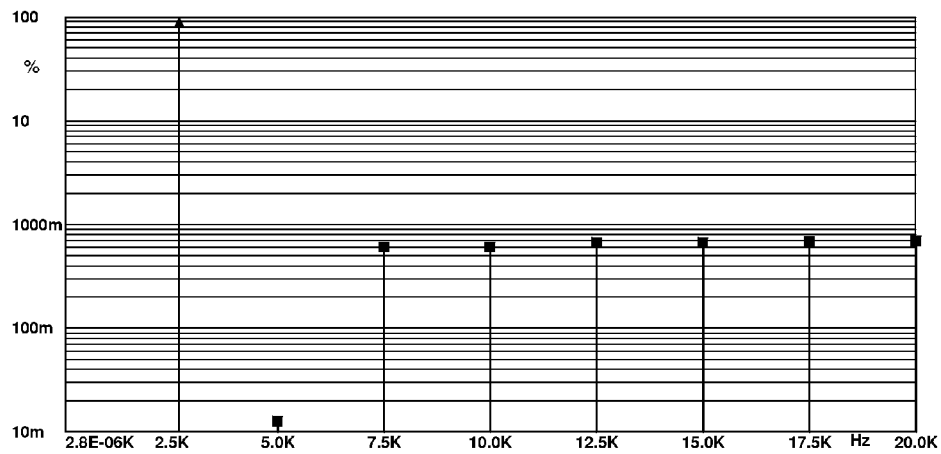

The resulting amplified square wave signal at node 27 and the filtered amplifier output signal at node 60 are shown in FIG. 3a, while the harmonic content in % of the signal at node 60 is shown by the spectrum in FIG. 3b. These figures illustrate how the harmonics introduced in the signal distort the signal at the output node 60, which should ideally be a 2.5 kHz sine wave.

Embodiments of the invention disclosed herein are directed towards reducing the distortion of the signal to be amplified in Class D amplifiers. Those skilled in signal processing will appreciate that a triangular waveform created by integrator 63 fitting precisely between two straight horizontal lines (e.g. the waveform in FIG. 5a) can be constructed with fast enough switching to have no frequency components in the range of an input 44 (e.g. the audio range) except a possible DC component, which is not an issue as it does not pass through capacitor 38. Thus, such a waveform would be free of the audio range harmonics which distort the final amplified signal.

To achieve such a triangular waveform, the threshold voltages at comparator inputs 31 and 32 may be controllable variables rather than constant values. In this manner, the threshold voltages are varied to anticipate the overshoot of the signal, thus causing the resulting triangular waveform to lie between two horizontal lines and to have upper and lower peaks which fall within a preselected range of the horizontal lines (such as the waveform shown in FIG. 5a).

One embodiment of the invention is a Class D amplifier apparatus, comprising: a pulse width modulator 80 configured to compare a triangular signal 28 to an upper and lower threshold value 31, 32 to generate a square wave 27; and a threshold controller 10 configured to store upper and lower sample values 65, 66 of the triangular signal 28, to compute an upper difference between a target upper threshold value 71 and the upper sample value 65, to compute a lower difference between a target lower threshold value 72 and the lower sample value 66, and based on the upper and lower differences, to update the upper and lower threshold values 31, 32. In some embodiments of the invention, the upper difference is computed by subtracting the target upper threshold value 71 from the upper sample value 65, and the lower difference is computed by subtracting the target lower threshold value 72 from the lower sample value 66. In such embodiments the upper and lower threshold values 31, 32 may be updated by subtracting the upper and lower differences from them. If the order of subtraction of the target threshold values 71, 72 and sample values 65, 66 is reversed, the update may be performed with an addition operation. It will be understood by one skilled in the art that either of these configurations may be suitable and that a specific one may be selected if it provides advantages in circuit design. In some embodiments, the pulse width modulator 80 may compare the signals and thresholds with a comparator 45, 46, and may have other functions in addition to that described, such as creating the triangular signal 28 with an integrator 63.

In some embodiments, the threshold controller 10 is configured to store the upper and lower sample values 65, 66 in response to a preselected feature in the square wave 27. This preselected feature may, in non-limiting examples, be a rising edge, a falling edge, or a preselected value of the square wave signal 27. In one embodiment, the threshold controller 10 is configured to charge a first capacitor 29 with the triangular signal 28 and to stop in response to a rising edge of the square wave 27, and is configured to charge a second capacitor 30 with the triangular signal 28 and to stop in response to a falling edge of the square wave 27.

Further, the upper and lower sample values 65, 66 of the triangular signal 28 may be taken in a number of ways. For example, in one embodiment the upper sample value 65 is an upper peak of the triangular signal 28, and the lower sample value 66 is a lower peak of the triangular signal 28. In the case of the embodiment shown in FIG. 4 comprising a self oscillating amplifier, the triangular waveform 28 reaches its peaks at the time of zero crossing (during the rising/falling edges) of signal 27, because the integrator integrates signal 27 and thus 27 is derivative of 28 reaching zero at the local maxima and minima of 28. Therefore, in such embodiments, storing the sample values 65, 66 of the triangular signal 28 in response to the rising and falling edges of signal 27 is one method to capture the peak values of triangular signal 28. In some embodiments, the threshold controller 10 is configured to update the upper threshold value 31 by subtracting the upper difference from the upper threshold value 31 and to update the lower threshold value 32 by subtracting the lower difference from the lower threshold value 32. In such embodiments, the threshold controller 10 may store the thresholds in any manner suitable known in the art; for example, the threshold controller 10 may be configured to store the upper threshold value (possibly relative to another value) on a first capacitor 35, to store the lower threshold value (possibly relative to another value) on a second capacitor 37, and to subtract the differences by charging or discharging each of the first and second capacitors 35, 37 for a preselected period of time. In the embodiment shown in FIG. 4, it will be appreciated that capacitors 35 and 37 store the upper and lower threshold values 31, 32 relative to the target upper and lower threshold values 71, 72. Based on the detailed design of the embodiment, one skilled in the art may select the preselected period of time to be the same or different for each of the first and second capacitors 35, 37.

The threshold controller circuit 10 may update the upper and lower threshold values 31, 32 at any time or times within the period of the triangular signal 28, and may change its frequency of updating over time. In one embodiment, the triangular signal 28 comprises a plurality of upper and lower peaks, and the threshold controller 10 is configured to update the upper threshold value 31 once in between each pair of successive upper peaks, and to update the lower threshold value 32 once in between each pair of successive lower peaks.

In order to coordinate all of the aforementioned operations, the threshold controller 10 may comprise a control logic block 20. The control block 20 may be any number of electronic components known to one skilled in the art, and may for instance be an integrated circuit, microprocessor, or a circuit of logic elements. In some embodiments, the control logic block 20 produces, in response to the triangular signal 28 and the square wave 27: a first signal 21 which is high between a time when the triangular signal 28 reaches a first preselected value while the square wave 27 is low, and a time when the square wave 27 has a rising edge, and is low otherwise; a second signal 22 which is high between a time when the triangular signal 28 reaches a second preselected value while the square wave 27 is high, and a time when the square wave 27 has a falling edge, and is low otherwise; a third signal 23 which has a rising edge at the same time as the first signal 21 and stays high for a first preselected period of time; and a fourth signal 24 which has a rising edge at the same time as the second signal 22 and stays high for a second preselected period of time. In such embodiments, the threshold controller 10 may comprise a first, second, third and fourth analog switches 11, 12, 13, 14, where the first analog switch 11 controls current flow to a first capacitor 29 for storing a first peak triangular signal value; the second analog switch 12 controls current flow to a second capacitor 30 for storing a second peak triangular signal value; the third analog switch 13 controls current flow to a third capacitor 37 for updating the lower threshold value; and the fourth analog switch 14 controls current flow to a fourth capacitor 35 for updating the upper threshold value.

Another embodiment of the invention is a method of processing Class D amplifier internal signals, comprising the steps of: storing a first and second threshold value 31, 32 in a first and second electronic component, respectively; measuring a first and second sample voltage 65, 66 of a triangular signal 28 and storing the first and second sample voltage 65, 66 in a third and fourth electronic component, respectively; storing a first and second target threshold voltage 25, 26 in a fifth and sixth electronic component, respectively; computing a first difference voltage between the first target threshold voltage 25 and the first sample voltage 65; computing a second difference voltage between the second target threshold voltage 26 and the second sample voltage 66; updating the first threshold voltage 31 with the first difference voltage, and updating the second threshold voltage 32 with the second difference voltage; and comparing the triangular signal 28 to the first and second threshold voltages 31, 32 to form a square wave 27. It will be appreciated that the first and second differences may be computed by subtracting the first and second target threshold voltages 25, 26 from the first and second sample voltages 65, 66, and in such embodiments the thresholds 31, 32 may be updated by subtracting the first difference voltage from the first threshold voltage 31, and by subtracting the second difference voltage from the second threshold voltage 32. Further, it will be appreciated that the order of subtraction of sample voltages 65, 66 and target threshold voltages 25, 26 may be reversed if then the updating step involves addition rather than subtraction, as has been discussed previously.

In an embodiment, the measuring step is conducted upon detecting a preselected feature of the square wave 27. For example, this feature may be a rising or falling edge, or a preselected value of the signal. Measuring the first and second sample voltage 65, 66 may comprise charging capacitors 29, 30 with the triangular signal 28; and storing the first and second sample voltage 65, 66 may comprise stopping charging of those capacitors 29, 30.

In another embodiment, the first and second sample voltage 65, 66 is an upper and lower peak of the triangular signal, respectively. Further, subtracting the differences may comprise charging or discharging capacitors 35, 37 for a preselected period of time. It is noted that this preselected period of time may be different for each of the capacitors 35, 37 that are used in this subtraction. Further, updating the first and second threshold voltages 31, 32 may occur at any time or rate. For instance, updating the first threshold voltage 31 may occur once in between each pair of successive upper peaks; similarly, updating the second threshold voltage 32 may occur once in between each pair of successive lower peaks.

The method may also include generating a first signal 21 which is high between a time when the triangular signal 28 reaches a first preselected value while the square signal 27 is low, and a time when the square wave 27 has a rising edge, and is low otherwise; generating a second signal 22 which is high between a time when the triangular signal 28 reaches a second preselected value while the square wave 27 is high, and a time when the square signal 27 has a falling edge, and is low otherwise; generating a third signal 23 which has a rising edge at the same time as the first signal 21 and stays high for a first preselected period of time; and generating a fourth signal 24 which has a rising edge at the same time as the second signal 22 and stays high for a second preselected period of time. In such embodiments, the method may further include: controlling a first analog switch 11 with the first signal 21, wherein the third electronic component is a third capacitor 29, and the first analog switch 11 controls current flow to the third capacitor 29 for storing a first peak triangular signal voltage; controlling a second analog switch 12 with the second signal 22, wherein the fourth electronic component is a fourth capacitor 30, and the second analog switch 22 controls current flow to the fourth capacitor 30 for storing a second peak triangular signal value; controlling a third analog switch 13 with the third signal 23, wherein the second electronic component is a second capacitor 37, and the third analog switch 13 controls current flow to the second capacitor 37 for updating the second threshold value 32; and controlling a fourth analog switch 14 with the fourth signal 24, wherein the first electronic component is a first capacitor 35, and the fourth analog switch 24 controls current flow to the first capacitor 35 for updating the first threshold value 31.

Figure 4:
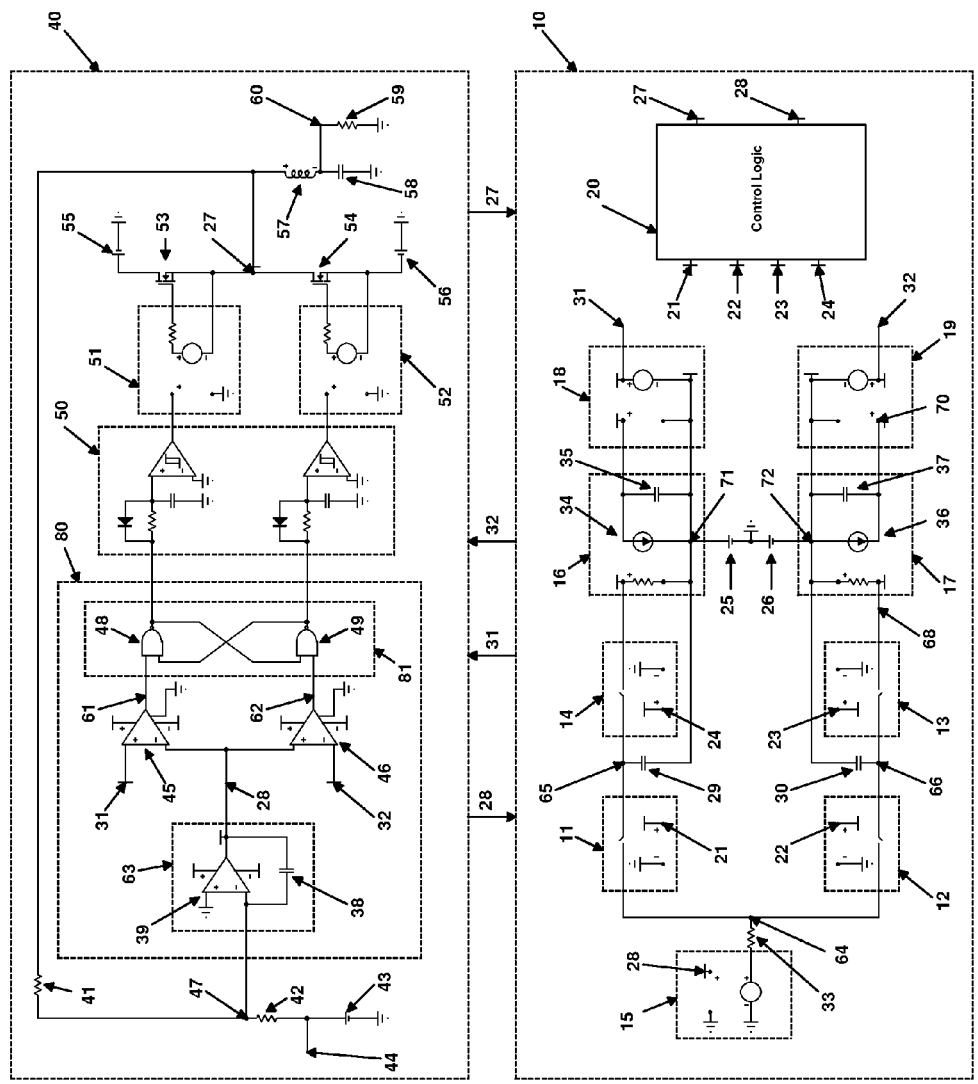
FIG. 4 is schematic view of class D amplifier with a threshold controller circuit.

An example circuit diagram of a Class D amplifier circuit with a threshold controller is shown in FIG. 4. It will be understood that this example is included for didactic purposes and it is not intended to limit the scope of the invention. Further, it will be understood that some elements in this figure are high-level abstract functional elements (e.g. control logic block 20, current source 34), while some elements are circuit schematic elements which represent specific physical entities (e.g. resistor 33). One skilled in the art will be able to discern the two types of elements in this figure, and will understand that many specific physical circuit designs will satisfy the functions of the abstract functional blocks.

In the embodiment shown in FIG. 4, a threshold control circuit 10 receives signals from a conventional amplifier 40, and adjusts the threshold voltages at comparator inputs 31 and 32 based on the received signals. The threshold voltages may, for example, be adjusted in every cycle of the amplifier switching. The amplifier 40 in this embodiment is identical to the amplifier in FIG. 1, except that the threshold voltages are now generated by a threshold control circuit 10. However, it will be appreciated that the amplifier 40 need not have this specific design; it may be any conventional Class D amplifier which relies on a threshold value for some portion of its signal processing.

Figure 5A:
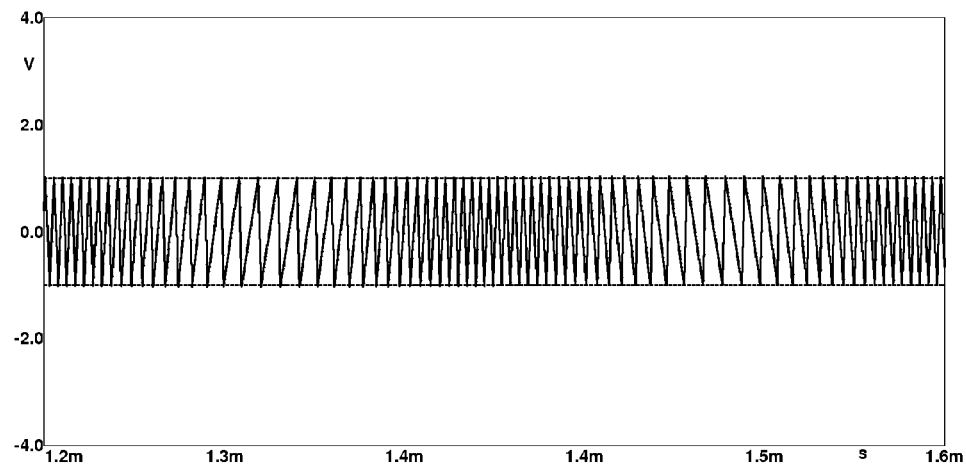
FIG. 5a shows integrator output signal at 2.5 kHz input signal using the threshold controller circuit.
Figure 5B:
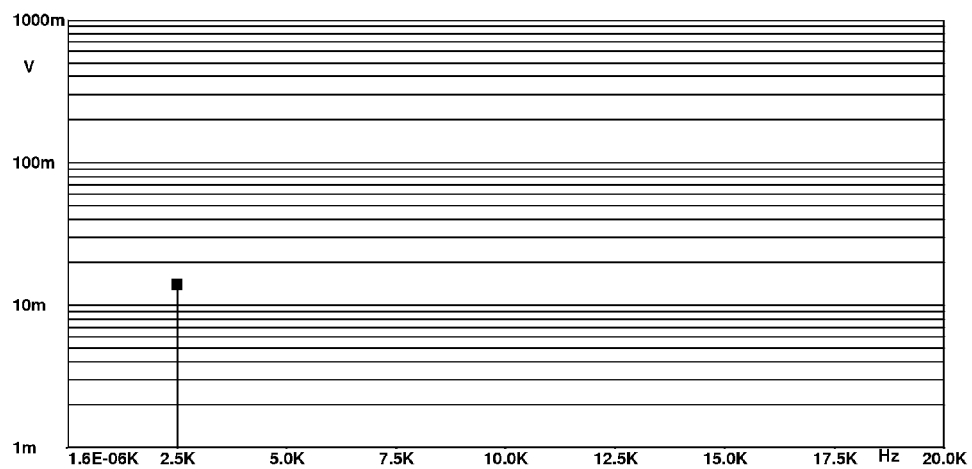
Figure 6A:
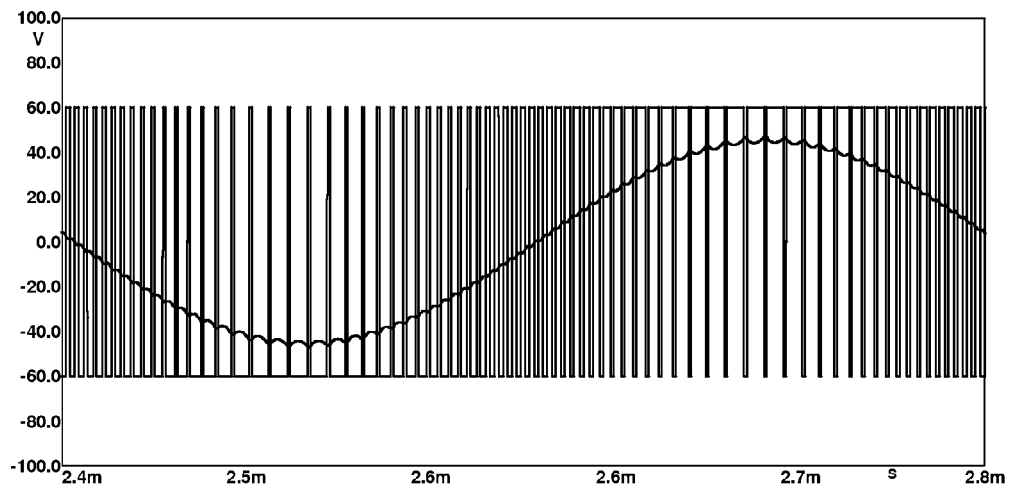
FIG. 6a shows amplifier output signals with 2.5 kHz sine input signal using the threshold controller circuit.
Figure 6B:
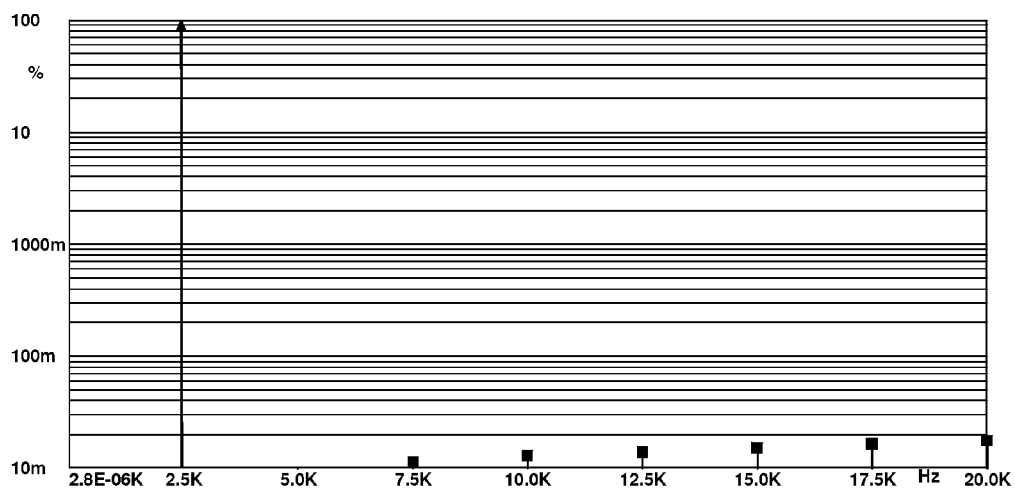

FIGS. 5a and 5b show the signal waveform and its spectrum at integrator output 28, with the input being a 2.5 kHz sine wave at input 44, when the embodiment of the threshold control circuit 10 shown in FIG. 4 operates. It is noted that the two limiting lines in FIG. 5a at +1 and −1V illustrate target threshold voltages, while the actual threshold voltages at comparator inputs 31 and 32 are varying due to the threshold control circuit 10. FIGS. 6a and 6b show the amplifier output signals at nodes 27 and 60, and highlight the significant reduction in audio range harmonics causing distortion as compared with the signal shown in FIGS. 3a and 3b.

The embodiment of the threshold control circuit 10 shown in FIG. 4 contains several functional blocks, which will be discussed below. It takes two signals from amplifier through wires 27 and 28 and generates two signals for the amplifier present in wires 31 and 32.

Figure 7:
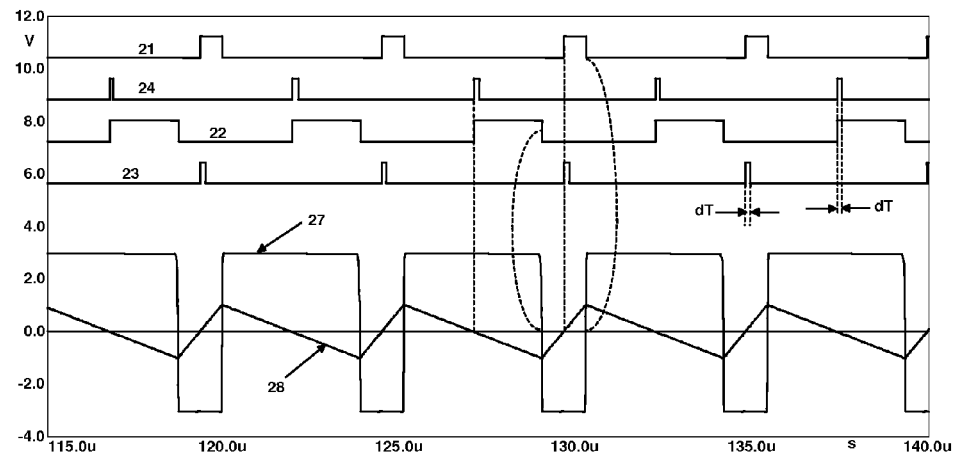
FIG. 7 shows the input and output signals of the control logic block shown in FIG. 4.

Signal 28 is delivered to the block of control logic 20 and buffer 15, and signal 27 is delivered to block 20. Block 20 generates four logic signals based on signals 28 and 27: 21, 22, 23 and 24, which are shown in FIG. 7. Signal 21 is high between the time when signal 28 crosses zero while signal 27 is negative and the time when signal 27 crosses zero while changing from negative to positive values. Similarly, signal 22 is high between the time when signal 28 crosses zero while signal 27 is positive and the time when signal 27 crosses zero while changing from positive to negative values. Signal 23 goes high at the same time as signal 21, and signal 24 at the same time as signal 22, and the duration of the high levels of signals 23 and 24 may be limited to predetermined value dT. It will be appreciated that the durations of the impulses 23 and 24 do not need to be identical. Furthermore, there are many specific designs of the electronics inside block 20 which will satisfy the timing diagram shown in FIG. 7, and such designs will be well known by one skilled in the art; thus, the design of block 20 will not be described in detail herein.

Threshold control circuit 10 further comprises four analog switches: 11, 12, 13 and 14 controlled by logic signals 21, 22, 23 and 24 respectively. It will be understood that analog switches may be any electronic switching element, such as but not limited to, MOSFETs, FETs, bipolar junction transistors and other types of transistor or analog integrated switches. If any of the logic signals 21, 22, 23 or 24 is high, the corresponding switch is closed, and vice versa for low logic signals.

Threshold control circuit 10 further comprises three unity gain buffers 15, 18 and 19; two storage capacitors 29 and 30; two target reference voltage sources 25 and 26 and two integrators 16 and 17. Integrators use voltage controlled current sources 34 and 36 which charge capacitors 35 and 37 respectively. The target reference voltage sources 25 and 26 have voltages which are the target values for the peaks of triangular signal 28. The unity gain buffers 15, 18, and 19 are present so that the amplifier 40 circuit does not put an electrical load on the threshold controller 10 and vice versa. That is to say, buffers 18 and 19 prevent capacitors 35 and 37 from being discharged by the input resistance at nodes 31 and 32. It will be appreciated by one skilled in the art that the buffers 15, 18 and 19 need not have unity gain; such unity gain buffers are intended to be exemplary only, and with simple modification to the circuitry presented herein other values of gain may be used. Further, node 64 is a common input node for switches 11 and 12. Node 68 is the output of the switch 13 controlling current source 36 charging capacitor 37. Node 70 is the input of the buffer 19.

Figure 8:
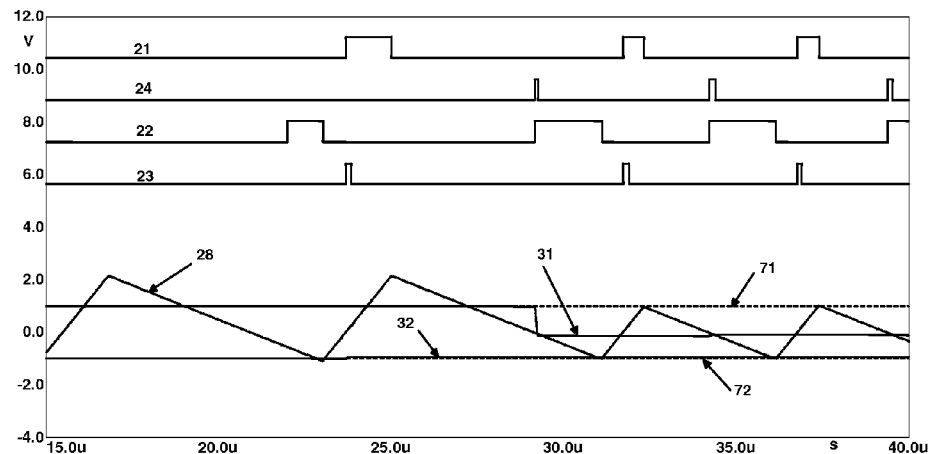
FIG. 8 shows the output signals of the control logic block and the varying thresholds generated by the threshold controller shown in FIG. 4.

The operation of the threshold control circuit 10 will be described with the reference to FIG. 4 and the exemplary waveforms in FIG. 8 at some arbitrary input voltage. FIG. 8 shows that at the beginning of the operation the threshold control circuit is not active, all logic control signals are low, all analog switches are open, and that initially capacitors 29, 35, 30 and 37 are fully discharged. It will be appreciated that the values of target reference voltages sources 25 and 26 are not critical for the operation of the amplifier 40 or threshold control circuit 10, and are shown herein to be equal to +1V and −1V respectively, merely as an example. The analysis of circuit 10 without the control logic block 20 active shows that the voltages at 31 and 32 are also equal to +1V and −1V. Amplifier 40 operates in this case as a conventional one and the waveform 28 exhibits noticeable overshoots, as shown in FIG. 2a.

At some point in time, the control logic block 20 and the switches start to operate. After switch 11 is closed, the voltage at 65 starts to follow the voltage at 28 and capacitor 29 charges. The moment this switch opens, capacitor 29 stores as its voltage the positive peak voltage of signal 28. The voltage across capacitor 29 remains constant until switch 11 closes again, thus sampling and storing the peak value at each cycle. Similarly, switch 12 and capacitor 30 work together to sample and hold the negative peak value of triangular signal 28. It will be appreciated that the more accurately stored the values of the positive and negative peak values of the triangular waveform, the more the distortion of the final amplified signal will be reduced. Further, it will be understood that the sampling may start anytime before signal 28 reaches peak values during each cycle, provided the storage capacitors can charge and/or discharge quickly enough such that the stored values are within a preselected tolerance of the actual peak values.

In the next step, the switch 14 closes for a predetermined value of time dT and voltage controlled current source 34 charges capacitor 35, incrementing or decrementing its voltage. Simple analysis of circuit 10 leads to the following equation:

$$dV(69)=k \cdot (V(65)-V(71)) \quad (1)$$

where V(65) and V(71) are voltages at the specified node numbers, dV(69) is an increment of V(69), and k is a constant. It will be appreciated by one skilled in the art that parameters of current source 34, the value of capacitor 35 and dT can be selected such that k=−1. Further, knowing that $V(65)=V_p$ is the positive peak voltage, $V(71)=V_{rp}$ is the positive target reference voltage and V(69)=V(31) one can write equation (2)

$$dV(31)=Vrp-Vp \quad (2)$$

Similarly, the following equation (3) may be derived for the negative peaks:

$$dV(32)=Vrn-Vn \quad (3)$$

where $V_{rn}$ is the negative target reference voltage, and $V_n$ is the negative peak voltage.

Equations (2) and (3) show that the values of the voltages at comparators inputs 31 and 32 are incremented by the difference between targeted peak values and real values. With reference to FIG. 8, initially the positive peak of signal 28 is much higher than 1V so voltage 31 has a step down. In the next cycle, the positive peak reaches +1V, the negative peak reaches −1V and voltages 31 and 32 remain almost unchanged until input signal changes. The waveforms of this exemplary embodiment presented in FIG. 8 show a relatively large jump in voltage 31; this is because initially, for demonstration, the threshold control circuit 10 was not active. It will be understood by one skilled in the art that the input signal typically changes much more slowly than the amplifier switching, and thus the steps in voltages 31 and 32 are usually much smaller than what is depicted in FIG. 8.

It will be understood that, while the constant k in the exemplary embodiments herein is generally equal to −1, it need not be; however, if it differs from −1 then it may take more cycles for threshold voltages to stabilize. Further, while the examples herein have a positive $V_{rp}$ and negative $V_{rn}$, this is not necessary; they may both be positive or negative, where the only requirement is that $V_{rp} > V_{rn}$. Further, while the zero crossing of waveform 28 is one choice to initiate impulses 23 and 24, these impulses may be initiated at any time. In some embodiments, the threshold control circuit 10 may be designed such that a single 23 impulse fits between two consecutive 22 pulses, and a single 24 impulse fits between two consecutive 21 pulses. The functional blocks of the threshold control circuit 10 may be built using conventional techniques and components well known to one skilled in the art, and as such these will not be described at the schematic level.

It is noted that in this particular type of Class D amplifier, the switching frequency varies with the input signal level. In the embodiments shown herein, the switching frequency is the highest with a zero volt input signal and lowers when output signal approaches either of supply voltages, and the switching frequency is proportional to the peak to peak value of integrator output. Such embodiments reduce the peak to peak values, and at the same time reduce the variations in amplifier switching frequency. However, it will be understood that pulse width modulators using constant switching frequency with stationary triangular waveform generator may also be used with the threshold control circuit 10. However, it will be understood that modifications would need to be made to the embodiments disclosed herein; for example, storing the value of triangular waveform at zero crossing of output signal does not return its peak value with a PWM scheme using a constant switching frequency.

Figure 9:
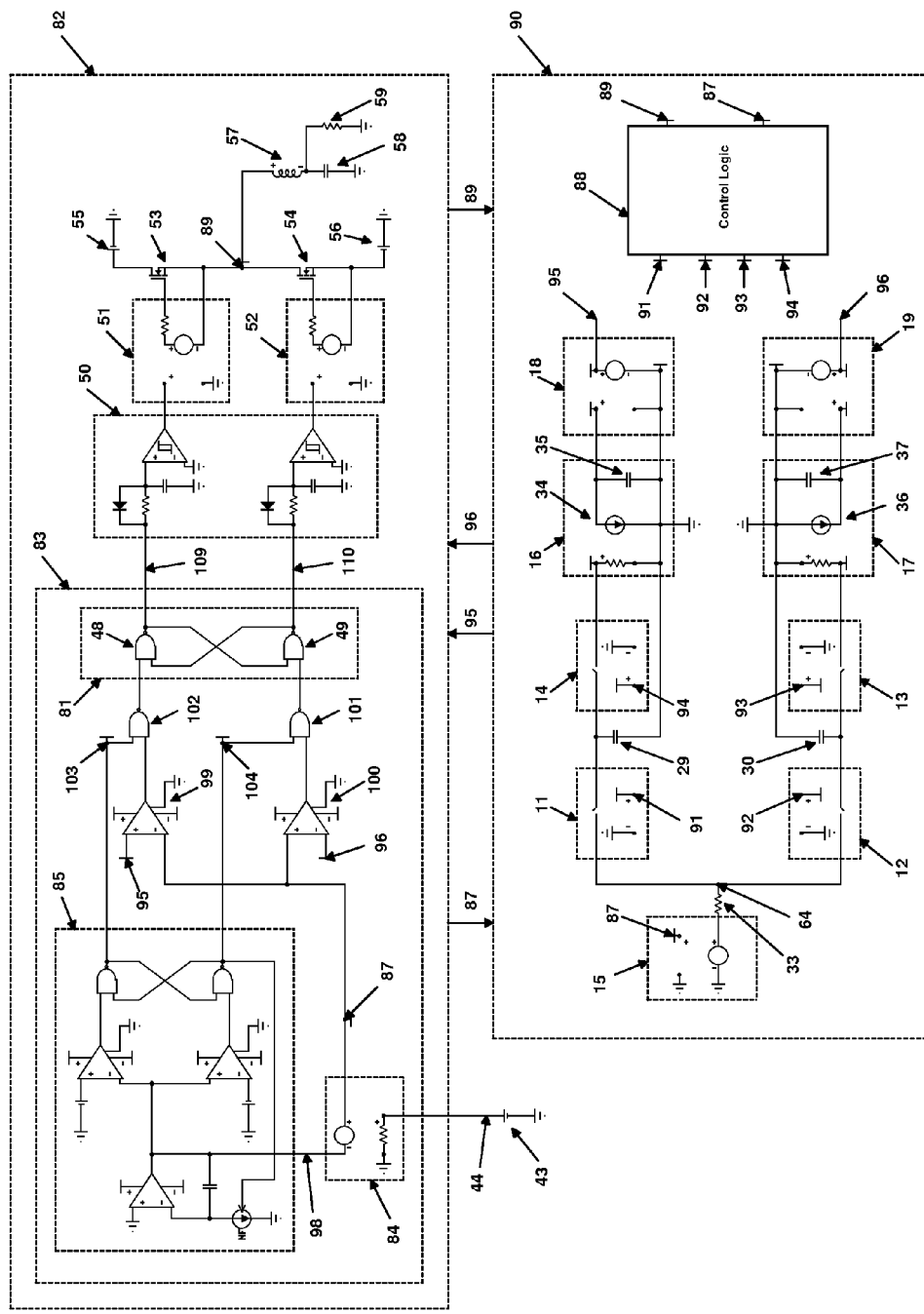
FIG. 9 shows the threshold controller circuit connected to a different class D amplifier.
Figure 10:
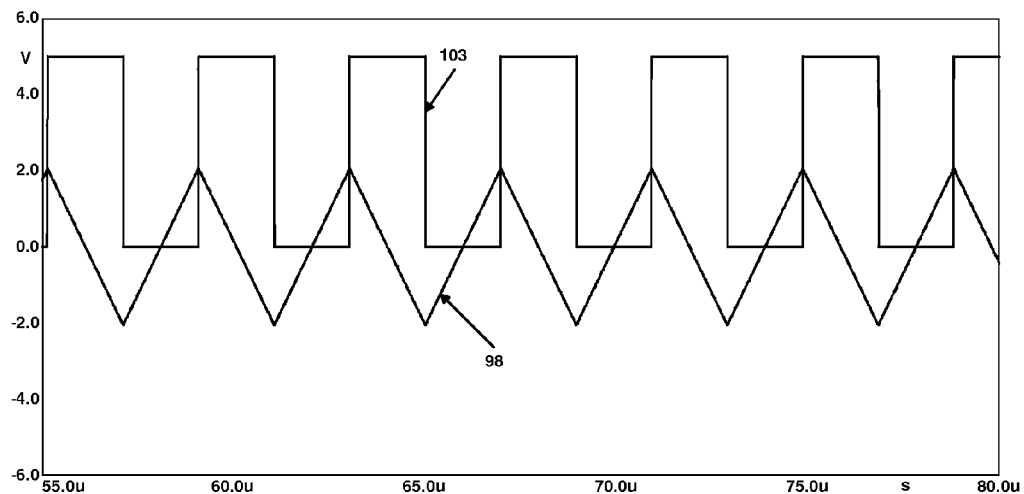
FIG. 10 shows the signals at the outputs of triangular and square wave generator in the amplifier shown in FIG. 9.

As an example, the threshold controller may be used with a class D amplifier which operates by employing constant frequency triangular waveform generator. The example of this type of amplifier with invented circuit is shown in FIG. 9. The power stage of amplifier 82 is identical to the power stage of amplifier 40, and includes the previously presented elements 50, 51, 52, 55, 56, 53, 54, 57, 58 and 59. The main difference between this amplifier 82 and the previously presented amplifier 40 is that the PWM circuitry 83 contains a triangular waveform generator 85. Further, in addition to generating triangular signal 98 it also generates two square waves 103 and 104. Signals 98 and 103 are shown in FIG. 10, while signal 104 is not shown for clarity as it is just an inversion of signal 103.

In this embodiment, the input signal 44 is added to triangular signal 98 in block 84 creating signal 87. Signal 87 is fed to the inputs of comparators 99 and 100, while the other inputs of comparators 99 and 100 are connected to the threshold controller circuit 90 through wires 95 and 96. The comparators outputs and signals 103 and 104 are connected to the gates 102 and 101. The output signals of gates 102 and 101 control a flip-flop 81. In this embodiment, the signals 95 and 96 represent threshold voltages. The circuit 83 allows voltage 95 to control the positive transition of signal 109, and allows voltage 96 to control the negative transition.

Figure 11:
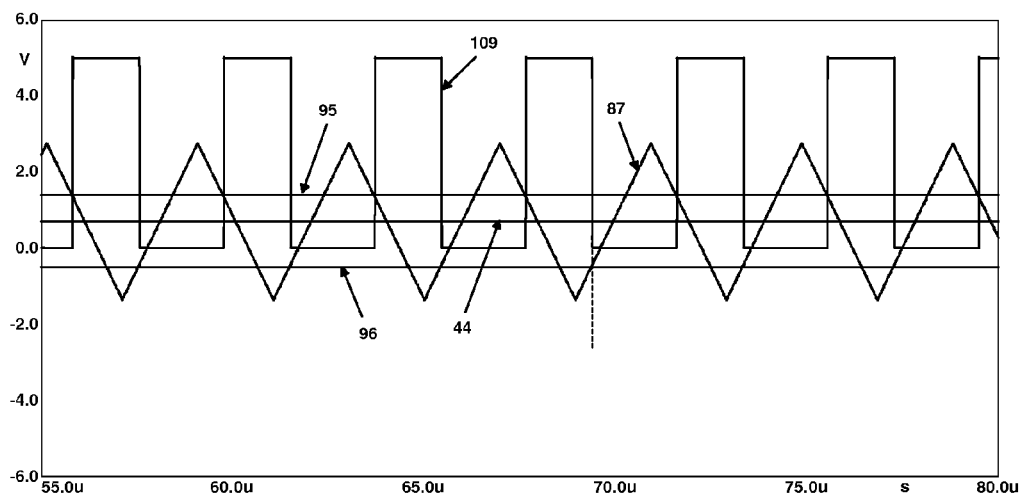
FIG. 11 shows input and output signals in pulse width modulator in the amplifier shown in FIG. 9.
Figure 12:
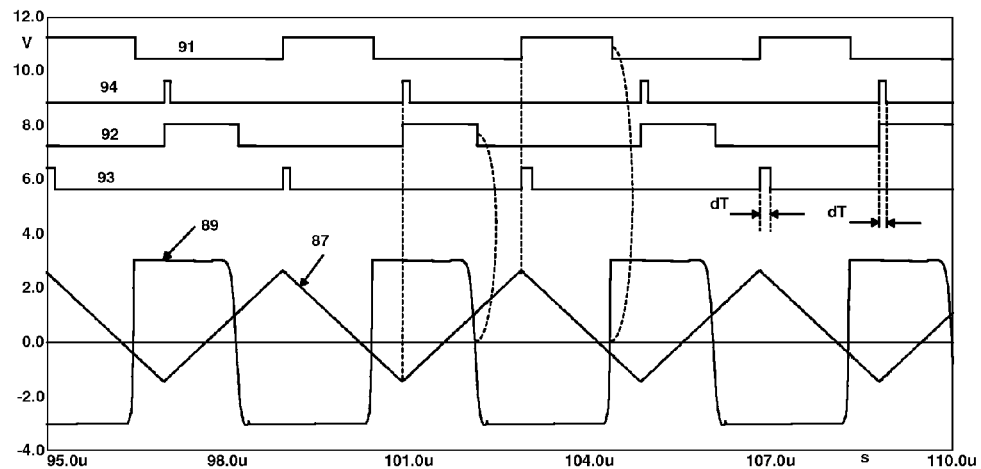
FIG. 12 shows input and output signals in the control logic block in the amplifier shown in FIG. 9.
Figure 13:
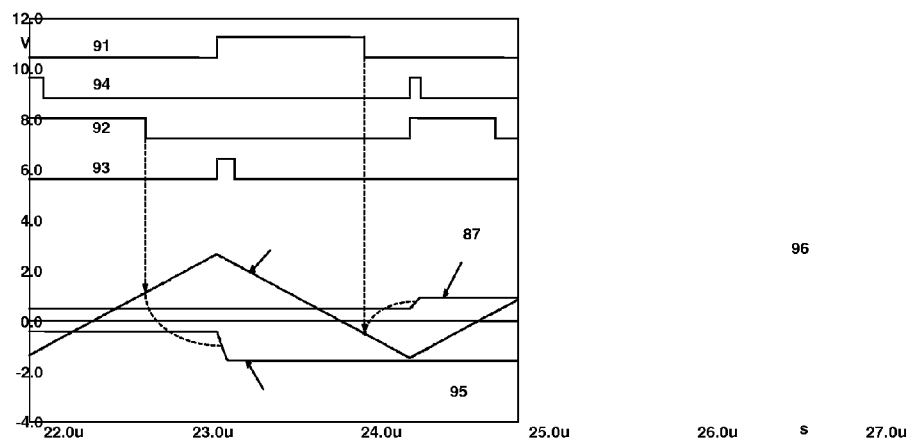
FIG. 13 shows waveforms in threshold controller circuit connected to the amplifier shown in FIG. 9.

Signals 44, 95, 96, 87 and 109 are shown in FIG. 11. The waveforms in FIG. 11 were generated assuming some arbitrary positive value for the threshold voltage 95 and negative for 96. One skilled in the art will notice that signal 109 changes from low to high when the positive slope of signal 87 crosses threshold 95 and 109 changes from high to low when negative slope of 87 crosses threshold 96. In this illustrative embodiment, the threshold controller 90 is very similar to controller 10 except that target threshold voltages are now equal to zero; thus, voltage sources 25 and 26 are removed and nodes 71 and 72 are connected to ground. Further, the nodes or wires in circuit 90 are numbered differently because the signals may be different. The control logic block has also been modified; it takes signal 89 from amplifier output and senses its zero crossing. It takes signal 87 and detects its peak values. For this purpose the signal 103 or 104 may also be used. Similarly to circuit 20 controller 88 output for signals 91, 92, 93, and 94 shown in FIG. 12. Signal 91 starts at maximum of 87 and ends at zero crossing of 89 during its transition from low to high. Signal 92 starts at minimum of 87 and ends at zero crossing of 89 during its transition from high to low. Signal 94 starts at the same time as 92 and has predetermined duration dT and signal 93 starts at the same time as 91 and has predetermined duration dT also. Signals 91, 92, 93 and 94 control switches 11, 12, 13 and 14 similarly to the previously described embodiment. The way the threshold voltages 95 and 96 are controlled is similar to how 31 and 32 are controlled. In both implementations the zero crossings of signals 27 and 89 are used to store the sample values of triangular waves 28 and 87. In both cases the circuits control the threshold voltages so at the zero crossing of 27 or 89 the voltages of triangular waves 28 or 87 are equal to appropriate targets. The waveforms 95 and 96 are shown in FIG. 13.

Figure 14:
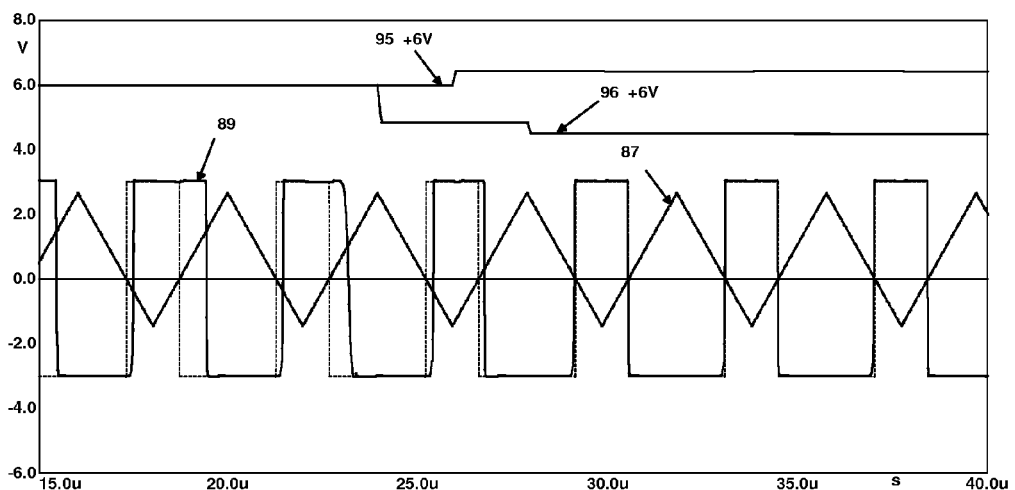
FIG. 14 demonstrates how the threshold controller improves the performance of the amplifier shown in FIG. 9, with dotted lines representing the desired square wave signal.

The result of the operation of circuit 90 is shown in FIG. 14. At the beginning circuit 90 does not operate and output voltage 89 differs from desired, shown as a dotted line. When circuit 90 is active the width of the output signal pulses 89 is the same as determined by the zero crossing of the signal 87. In some embodiments, the amplifier 82 has feedback circuit, although it is not shown here. One skilled in the art will appreciate that the threshold controller 90 reduces distortions of the amplifier with or without this feedback circuit.

While the description of embodiments herein often makes reference to the audio spectrum of signal frequencies, it will be understood by one skilled in the art that this range of frequencies is not preferred over other ranges of frequencies for use with embodiments herein in any way. It is merely used as a didactic tool for motivating the removal of distortion from signals which are amplified with a Class D amplifier.

Furthermore, while embodiments herein typically comprise a half bridge Class D amplifier, it will be understood that such amplifiers are merely exemplary and other Class D amplifiers may be used, for example, full-bridge amplifiers.

Furthermore, while a specific schematic of the threshold control circuit 10 is shown in FIG. 4, this embodiment is included merely for didactic purposes and should not be construed as limiting. For example, in some embodiments, processing and control may be completed partially or wholly in software or programmable hardware on a device with a suitable analog-to-digital input such as a microcontroller, personal computer, field-programmable gate array or other computing device. Further, a portion or all of the processing and control signals referred to herein may be digital signals or data which may be stored and manipulated in a computing device, and are not necessarily analog voltages. Functional blocks may also be combined to perform groups of certain operations, and may perform them simultaneously. For example, the order of subtracting voltages or signals may be reversed if it maintains the functionality disclosed herein and provides advantages in circuit design and implementation.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A Class D amplifier apparatus comprising:
    a pulse width modulator configured to compare a triangular signal to an upper and lower threshold value to generate a square wave; and
    a threshold controller configured to store upper and lower sample values of said triangular signal, to compute an upper difference between a target upper threshold value and said upper sample value, to compute a lower difference between a target lower threshold and said lower sample value, and based on said upper and lower differences, to update said upper and lower threshold values.

2. The apparatus according to claim 1 wherein said threshold controller is configured to compute said upper difference by subtracting said target upper threshold value from said upper sample value, and said threshold controller is configured to compute said lower difference by subtracting said target lower threshold value from said lower sample value.

3. The apparatus according to claim 2 wherein said threshold controller is configured to update said upper threshold value by subtracting said upper difference from said upper threshold value and to update said lower threshold value by subtracting said lower difference from said lower threshold value.

4. The apparatus according to claim 1 wherein said threshold controller is configured to compute said upper difference by subtracting said upper sample value from said target upper threshold value, and said threshold controller is configured to compute said lower difference by subtracting said lower sample value from said target lower threshold value.

5. The apparatus according to claim 4 wherein said threshold controller is configured to update said upper threshold value by adding said upper difference to said upper threshold value and to update said lower threshold value by adding said lower difference to said lower threshold value.

6. The apparatus according to claim 1 wherein said threshold controller is configured to store said upper and lower sample values in response to a preselected feature in said square wave.

7. The apparatus according to claim 6 wherein said threshold controller is configured to store said upper sample value in response to a rising edge of said square wave, and is configured to store said lower sample value in response to a falling edge of said square wave.

8. The apparatus according to claim 7 wherein said threshold controller is configured to charge a first capacitor with said triangular signal and to stop in response to a rising edge of said square wave, and is configured to charge a second capacitor with said triangular signal and to stop in response to a falling edge of said square wave.

9. The apparatus according to claim 1 wherein said upper sample value is an upper peak of said triangular signal, and said lower sample value is a lower peak of said triangular signal.

10. The apparatus according to claim 9 wherein said threshold controller is configured to update said upper threshold value by subtracting said upper difference from said upper threshold value and to update said lower threshold value by subtracting said lower difference from said lower threshold value.

11. The apparatus according to claim 10 wherein said threshold controller is configured to store said upper threshold value relative to said target upper threshold value on a first capacitor, to store said lower threshold value relative to said target lower threshold value on a second capacitor, and to subtract said differences by charging or discharging each of said first and second capacitors for a preselected period of time.

12. The apparatus according to claim 1 wherein said triangular signal comprises a plurality of upper and lower peaks, and wherein said threshold controller is configured to update said upper threshold value once in between each pair of successive upper peaks, and to update said lower threshold value once in between each pair of successive lower peaks.

13. The apparatus according to claim 1 wherein said threshold controller comprises a control logic block which produces, in response to said triangular signal and said square wave:
 a first signal which is high between a time when said triangular signal reaches a first preselected value while said square wave is low, and a time when said square wave has a rising edge, and is low otherwise;
 a second signal which is high between a time when said triangular signal reaches a second preselected value while said square wave is high, and a time when said square wave has a falling edge, and is low otherwise;
 a third signal which has a rising edge at the same time as said first signal and stays high for a first preselected period of time; and
 a fourth signal which has a rising edge at the same time as said second signal and stays high for a second preselected period of time.

14. The apparatus according to claim 13 wherein said threshold controller comprises first, second, third and fourth analog switches, and said first, second, third and fourth signals control said analog switches.

15. The apparatus according to claim 14 wherein
 said first analog switch controls current flow to a first capacitor for storing a first peak triangular signal value;
 said second analog switch controls current flow to a second capacitor for storing a second peak triangular signal value;
 said third analog switch controls current flow to a third capacitor for updating said lower threshold value; and
 said fourth analog switch controls current flow to a fourth capacitor for updating said upper threshold value.

16. A method of processing Class D amplifier internal signals, comprising the steps of:
 a) storing a first and second threshold value in a first and second electronic component, respectively;
 b) measuring a first and second sample voltage of a triangular signal and storing said first and second sample voltage in a third and fourth electronic component, respectively;
 c) storing a first and second target threshold voltage in a fifth and sixth electronic component, respectively;
 d) computing a first difference voltage between said first target threshold voltage and said first sample voltage;
 e) computing a second difference voltage between said second target threshold voltage and said second sample voltage;
 f) updating said first threshold voltage with said first difference voltage, and updating said second threshold voltage with said second difference voltage; and
 g) comparing said triangular signal to said first and second threshold voltages to form a square wave.

17. The method according to claim 16 wherein
 step d) comprises subtracting said first target threshold voltage from said first sample voltage to form said first difference voltage;
 step e) comprises subtracting said second target threshold voltage from said second sample voltage to form said second difference voltage; and
 step f) comprises updating said first threshold voltage by subtracting said first difference voltage from said first threshold voltage, and updating said second threshold voltage by subtracting said second difference voltage from said second threshold voltage.

18. The method according to claim 16 wherein
 step d) comprises subtracting said first sample voltage from said first target threshold voltage to form said first difference voltage;
 step e) comprises subtracting said second sample voltage from said second target threshold voltage to form said second difference voltage; and
 step f) comprises updating said first threshold voltage by adding said first difference voltage to said first threshold voltage, and comprises updating said second threshold voltage by adding said second difference voltage to said second threshold voltage.

19. The method according to claim 16 wherein step b) is conducted upon detecting a preselected feature of said square wave.

20. The method according to claim 19 wherein storing said first and second sample voltage occurs in response to a rising and falling edge of said square wave, respectively.

21. The method according to claim 20 wherein said third and fourth electronic components are third and fourth capacitors, respectively; wherein measuring said first and second sample voltage comprises charging said third and fourth capacitors with said triangular signal, respectively; and wherein storing said first and second sample voltage comprises stopping charging of said third and fourth capacitors with said triangular signal.

22. The method according to claim 16 wherein said first and second sample voltage is an upper and lower peak of said triangular signal, respectively.

23. The method according to claim 22 wherein said first and second electronic components are first and second capacitors, respectively; and said subtracting differences comprises charging or discharging each of said first and second capacitors for a preselected period of time.

24. The method according to claim 16 wherein said triangular signal comprises a plurality of upper and lower peaks; updating said first threshold voltage occurs once in between each pair of successive upper peaks; and
   updating said second threshold voltage occurs once in between each pair of successive lower peaks.

25. The method according to claim 16 further comprising the steps of:
   generating a first signal which is high between a time when said triangular signal reaches a first preselected value while said square wave is low, and a time when said square wave has a rising edge, and is low otherwise;
   generating a second signal which is high between a time when said triangular signal reaches a second preselected value while said square wave is high, and a time when said square wave has a falling edge, and is low otherwise
   generating a third signal which has a rising edge at the same time as said first signal and stays high for a first preselected period of time; and
   generating a fourth signal which has a rising edge at the same time as said second signal and stays high for a second preselected period of time.

26. The method according to claim 25 further comprising the steps of:
   controlling a first analog switch with said first signal, wherein said third electronic component is a third capacitor, and said first analog switch controls current flow to said third capacitor for storing a first peak triangular signal voltage;
   controlling a second analog switch with said second signal, wherein said fourth electronic component is a fourth capacitor, and said second analog switch controls current flow to said fourth capacitor for storing a second peak triangular signal value;
   controlling a third analog switch with said third signal, wherein said second electronic component is a second capacitor, and said third analog switch controls current flow to said second capacitor for updating said second threshold value; and
   controlling a fourth analog switch with said fourth signal, wherein said first electronic component is a first capacitor, and said fourth analog switch controls current flow to said first capacitor for updating said first threshold value.

* * * * *